US008916245B2

(12) United States Patent
Mansour, II

(10) Patent No.: US 8,916,245 B2
(45) Date of Patent: Dec. 23, 2014

(54) SAFE PRESSURE SYSTEM VIEWING PORT

(76) Inventor: Joseph Alexander Mansour, II, Sunnyvale, CA (US)

( * ) Notice: Subject to any disclaimer, the term of this patent is extended or adjusted under 35 U.S.C. 154(b) by 879 days.

(21) Appl. No.: 12/455,934

(22) Filed: Jun. 8, 2009

(65) Prior Publication Data
US 2010/0310797 A1 Dec. 9, 2010

(51) Int. Cl.
*E06B 3/00* (2006.01)
*E06B 7/00* (2006.01)
*F21V 33/00* (2006.01)
*G02B 27/00* (2006.01)
*B01J 3/00* (2006.01)
*H01L 21/00* (2006.01)

(52) U.S. Cl.
CPC .. B01J 3/004 (2013.01); B01J 3/00 (2013.01); H01L 21/00 (2013.01)
USPC ....... 428/34; 52/171.1; 362/311.05; 362/455; 359/894; 378/140; 378/161

(58) Field of Classification Search
USPC ........ 428/34; 52/204.6, 786.1, 786.13, 171.1; 362/311.05, 455; 378/140, 161; 359/894; 372/103; 600/176
See application file for complete search history.

(56) References Cited

U.S. PATENT DOCUMENTS

| | | | | | |
|---|---|---|---|---|---|
| 2,839,698 | A | * | 6/1958 | Bell | 378/140 |
| 3,935,463 | A | * | 1/1976 | Jacobsen | 250/373 |
| 4,041,930 | A | * | 8/1977 | Katona | 126/198 |
| 4,253,286 | A | * | 3/1981 | Katona | 52/171.1 |
| 5,317,618 | A | * | 5/1994 | Nakahara et al. | 378/161 |
| 2005/0078314 | A1 | * | 4/2005 | Kinney | 356/446 |

OTHER PUBLICATIONS

Walker, JET Diagnostics' Vacuum Windows, Development, Assessment of Failures, Classifications and Prep . . . Sep. 1995, pp. 33-36.

\* cited by examiner

*Primary Examiner* — Donald J Loney
(74) *Attorney, Agent, or Firm* — Ronald Craig Fish

(57) ABSTRACT

A fracture-safe viewport for a pressure system having a pressure port which is pumped by said pressure system to a pressure above or below atmospheric pressure, comprising a plurality of panes each capable of passing electromagnetic radiation therethrough, each pane being mounted inside a tubular structure and being hermetically sealed to the wall of the pressure chamber. Each of the panes may be a different material or any combination of materials may be used from the group comprising sapphire, glass and quartz or any other material through which a high powered laser or other electromagnetic beam may be directed without adverse consequences. Highly pure, defect-free, ultra-polished, single-crystal sapphire is preferred. Spacing between the panes is used in most embodiments to avoid shrapnel damage in case of catastrophic failure of a pane. Half-donut shaped or chimney-shaped strain relief mounts are used in some embodiments to relieve strain caused by differential rates of thermal expansion when the structure is heated.

12 Claims, 7 Drawing Sheets

LASER SAFE VIEWING PORT

SAFE PRESSURE SYSTEM VIEWING PORT

BACKGROUND OF THE INVENTION

Vacuum systems that can generate high vacuums are used for many purposes such as semiconductor manufacture, research experimentation in companies and universities, etc. Such vacuum systems often have expensive turbo pumps, ionization gauges, getter pumps, diffusion pumps, substrates and other materials which are susceptible to damage from any component of air such as oxygen or water vapor. For example, oxygen in inrushing air and reacts with heated surfaces or other heated materials and oxidizes them. To repair or replace such pumps and other equipment can cost thousands to millions of dollars depending upon how complicated the system is.

Many such vacuum systems have viewing ports through which the experimenter or engineer interested in the process going on inside the vacuum system can look. Typically, these viewing ports are round metal structures surrounding a transparent pane of glass or other electromagnetically transparent material. The pane of glass or other material must has sufficient strength to withstand the pressure on the pane from the atmosphere based upon the pressure differential between the atmospheric pressure and the much lower pressure in the vacuum chamber. If one could create a perfect vacuum, the atmospheric pressure acting on the pane would be 14.6 psi. The transparent pane of the viewing port is mounted within a metal structure and hermetically sealed so as to seal the vacuum in. Typically these metal structures are round ports, and only one pane of glass or other material is used with the diameter of the port being from 2.75 inches to 4 inches in diameter. Some ports can be as large as 10 inches in diameter. Thicknesses of the pane vary depending on the diameter of the port and are between 1 millimeter and 6.5 millimeters thick with 4 mm being typical.

Some applications for vacuum systems require a laser beam to be shined through the viewing port. Such applications include at least the following.
1) Pulse laser deposition. This is a thin film deposition technique where a high power laser beam is focused inside a vacuum chamber to strike a target of the desired composition. Material vaporized from the target is deposited as a thin film on a substrate.
2) Laser driven particle acceleration: One technique for particle acceleration is crossing laser beams in a vacuum. This causes longitudinal electric fields in the laser pattern to accelerate electrons in an electron beam directed into the intersection of the laser beams.
3) Laser induced breakdown emission spectroscopy: This is a technique used to determine the elements in solids, liquids and aerosols. The method requires little or no sample preparation time and involves focusing a laser beam on a sample and collecting the light emitted from the sample as a result of the laser excitation. This is sometimes done in a vacuum to remove background signals caused by light emitted from excited substances other than the sample being analyzed.
4) Matrix assisted laser desorption mass spectrometry: This is a soft ionization technique used in mass spectrometry allowing the analysis of biomolecules such as proteins and peptides and sugars as well as large organic molecules such as polymers, etc. which tend to be fragile and to fragment when ionized by more conventional ionization methods. The ionization I triggered by a laser beam which is focused on a matrix which protects the biomolecules from being destroyed by direct contact with the laser beam. The matrix facilitates the vaporization and ionization. Typically the matrix is sinipinic acid.

The problem with directed high energy laser beams through a pane of transparent material is that such an act can cause destruction of the pane and breach of the vacuum integrity of the viewing port. When the pane is destroyed, fragments of the material can enter the vacuum chamber and be swept into the intake of the turbo vacuum pump(s). Debris ingestion can destroy or damage such pumps and engender high repair costs. The failure mechanisms are varied, but can involve skin oil smudges on the transparent pane or dirt or dust which can cause uneven localized heating to very high temperatures in some spots compared to cooler regions of the pane adjacent to the spots which have been unevenly heated. This can rupture the glass or cause a crack to start caused by rapid thermal expansion of one section of the transparent material relative to a cooler region adjacent the hot region. A crack can eventually or immediately cause the pane to fail because of the forces acting on the pane because of the pressure difference between the vacuum in the chamber and the atmospheric pressure pushing on the pane from the outside.

In addition, high pressure systems need viewing ports and they need to be fracture safe to keep particles from being blown into the eye of an observer. Fractures can start either from a mechanical blow or unequal heating caused by passing of a laser or other electromagnetic beam through the pane of a viewport. Fractures can be dangerous and expensive and are to be avoided.

A fracture-safe viewing port through which a laser beam or other electromagnetic beam of high energy can be directed into a pressure system chamber without causing breach of the vacuum or pressure integrity of the chamber is therefore needed.

DETAILED DESCRIPTION OF THE PREFERRED EMBODIMENT

Figure 1:
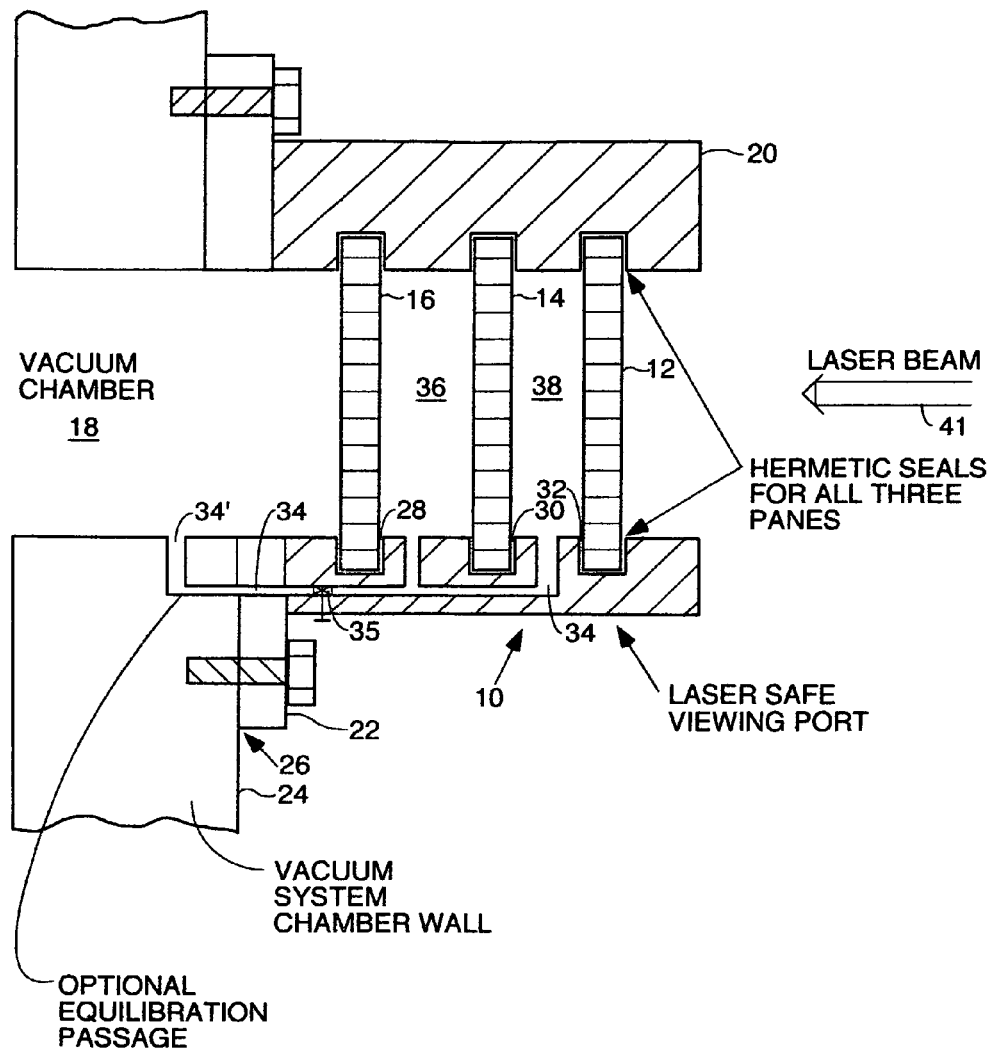
FIG. 1 is a cross-section drawing of a first embodiment of the fracture-safe vacuum system viewing port using three panes of transparent material.

In the preferred embodiment, a safe viewing port is provided which is useful for vacuum or high pressure systems. In particular, the safe viewing port is fabricated so as to be less likely to fail when a high power laser beam is directed through it, or somehow a mechanical impact on the outer pane causes a crack or a crack forms from thermal cycling or stress or chemical attack or material imperfections in any of the multiple panes. In most embodiments, two or more panes of visibly transparent or electromagnetically transparent material which are spaced apart and hermetically sealed to a frame which itself is hermetically sealed to a port into the vacuum chamber of a vacuum system. The panes may be made of sapphire, quartz and glass, silicon, gallium arsenide, indium phosphide, polycarbonate, magnesium fluoride, calcium fluoride, zinc selenide, zinc sulfide, silicon carbide, gallium nitride, yttrium iron garnet, yttrium aluminum garnet, lithium niobate, lithium tantalate, ZnSe, polymers or plastics, silicon, $MgF_2$ or any material which is transparent to electromagnetic radiation and which are strong enough to withstand the force on the panes caused by the pressure differential between the vacuum in the chamber and the atmosphere or a high pressure in the chamber of a high pressure system relative to the atmosphere. The most safe structure is two or more panes of ultra-polished, defect-free, single-crystal sapphire, separated by a distance from each other.

Preferably the space or spaces between the panes is equilibrated to the same pressure in the vacuum chamber. This eliminates the inrush of gas into the vacuum chamber in case the inner pane or panes all fail and reduces the stress on the inner panes from atmospheric pressure. A sudden inrush of gas can damage the turbine blades of the turbo pump by bending the rotating blades toward the stationary stator blades under the rotating blades while the turbine is spinning. If contact is made, the rotor blades can be ruined. Also, the inrush of gas can oxidize and destroy any hot cathode ionization guage, getter pumps, diffusion pumps, substrates and other materials which are susceptible to damage from any component of air such as oxygen or water vapor, etc. inside the chamber.

Each pane in the port may be made of one of these different materials in the list given above or all panes can be made of the same material or any combination of materials can be used for the multiple panes. One embodiment is to use different materials for each type layer because each different type of material has different strength properties. High-quality, flawless single-crystal, ultra-polished sapphire is preferred as the material for one or more panes because it has a high damage threshold. Ultra polished sapphire is any sapphire surface which is formed by any process which leaves the surface devoid of microcracks, scratches or inclusions. Examples of such processes are diamond turning or chemical polishing or chemical-mechanical polishing.

Many different structures for the frame which holds the panes may be used and the details of how the panes are attached to the frame and hermetically sealed are not critical.

The important factors that most if not all the embodiments share are as follows. The only factor that is required in all embodiments is the multiple panes of factor 5 below:

1) To act as backups for one another, the viewing port will use multiple panes of electromagnetically transparent material either of the same type or a different type such as sapphire, glass, quartz or other electronically transparent materials identified above that a visible, infrared or ultraviolet laser beam or any other form of electromagnetic radiation can pass through, where the laser beam may be of high power in some applications;

2) The panes of the viewing port may, in some embodiments, be separated by enough distance to avoid shrapnel damage by pieces of an exploding pane if a neighboring pane disintegrates or explodes;

3) The spaces between the panes should be open to an equilibration path that vents the spaces between multiple panes and the vacuum chamber so that the pressure between panes is substantially equal to the pressure in the vacuum chamber so as to prevent a sudden inrush of gas into the vacuum chamber if one of the inner panes fails. The equilibration path should be or contain a pinhole diameter orifice leading from the spaces between the panes to the vacuum chamber or a larger diameter tubular gas path connecting each of the spaces between the panes to the vacuum chamber with a valve in the gas path. The pinhole orifice flow restrictor is preferred but not necessary. In some embodiments, if a large gas path with a valve in it is used, there should a pinhole diameter orifice to act as a flow restrictor in case the valve is inadvertently left open or fails. If a valve is used, it can be opened at intermediate stages of the pump down closed after the final pressure is reached. Alternatively, any flow restrictor such as sintered metal in the gas path for all or part of its length may be may be used to prevent a sudden inrush of gas to the vacuum chamber.

4) The panes, or at least the outermost pane, should be of sufficient strength to withstand the force of the atmosphere pushing on the pane when the vacuum chamber has been evacuated. In the case of use of the safe viewing port on a high pressure system, the panes should be of sufficient strength to withstand the pressure acting thereon from inside the pressure system relative to atmospheric pressure. Preferably all panes will have sufficient strength to withstand atmospheric pressure to prevent a chain reaction failure and inrush of gas to the vacuum chamber if the outer pane fails.

5) A minimum number of panes is two so that there will be at least one backup pane in case either pane fails.

6) The surface finish and quality of the material of the panes should be high so as to avoid scratches or microcracks on the surface of the panes and crystal imperfections that can lead to mechanical failure.

7) There should be some mechanism to relieve stresses caused by different rates of thermal expansion between the material of the panes and the material of the frame when heating of the system occurs. In a ultra high vacuum system, the need for a strain relief mounting mechanism is more important to prevent stress buildup caused by differential rates of thermal expansion between the panes and the mounting mechanism when there is a temperature change.

Referring to FIG. 1, there is shown a cross-sectional view of one embodiment of a fracture-safe viewing port. The fracture-safe viewing port 10 depicted in this particular embodiment has three transparent panes 12, 14 and 16. Each of the panes is made of either glass, quartz or sapphire. Preferably, each of the three panes is a different material selected from the group: glass, quartz or sapphire, but in the embodiment shown in FIG. 1, all three panes are made of a single material, as represented by the identical cross-hatching. In such an embodiment, high quality, flawless, single-crystal sapphire is preferred as the material for all three panes because it has a high damage threshold. In all embodiments, it is preferred to have high quality, flawless, single-crystal sapphire as at least one of the panes. In some embodiments, other transparent materials which have sufficient strength may be substituted for one or more of these materials.

The reason this diversity in the materials of the panes is preferred is because each different type of material has a different strength of material property. Therefore, conditions that may cause failure of one pane are less likely to cause failure of the other two panes in a chain reaction catastrophic failure. However, any combination of these three types of material can be used such as the outer two panes 12 and 14 being sapphire and the inner pane being glass or quartz, or the innermost pane 16 being quartz and the outer two panes 12 and 14 being glass.

The thickness of the panes 12, 14 and 16 depends upon their strength, the diameter of the view port and the level of vacuum in the vacuum chamber 18. Typical diameters are from ¼ inch to 10 inches. Typically, the thicknesses of the panes used in the embodiments described herein are thicker than the 1 mm to 10 mm thicknesses used in prior art panes. Typical outside diameter of the metal frame is 2¾ inches with a window diameter for the panes of about 1½ inches for the embodiments described herein.

Each of the panes has a hermetic seal at the location of its physical engagement with the frame 20 of the viewing port. Typically, the viewing port is a round shaped tube having walls in which grooves are formed for mounting of the panes. One method to fabricate the viewing port would be to make a round viewing port tube with flange 22 for mounting the viewing port to the wall 24 of the vacuum chamber. Typically, the flange will be bolted to the wall 24 with a hermetic seal at the junction 26 of the wall and the flange.

The tube has three grooves 28, 30 and 32 formed therein in which the transparent panes will be mounted. To mount the panes in the grooves, the tube is sectioned into two mating half-pipes with mating flanges (not shown) on each. To assemble the viewing port, the grooves in the mating half-pipes are filled with sealing material such as epoxy, potting compound, glass, ceramic sealant or any other suitable sealant of sufficient strength and properties to form a hermetic seal and be compatible with vacuum environments. After the sealant (not separately shown) is placed in the grooves and before the sealant dries, the three panes are pressed into the grooves and the mating half-pipe is mated to the first half-pipe so that the panes are also engaged in the grooves of the mating half-pipe. Of course, the sealing compound must also be placed in the grooves of the mating half-pipe before the two half-pipes are mated and fastened together. The two half-pipes can be bolted, welded clamped or glued together, but preferably some method is used which does not permanently mate the two half-pipes together such that the structure can be taken apart and a pane which has been damaged may be replaced. Therefore, bolting or clamping is preferred. Likewise, a sealing compound which can be removed from a groove upon replacement of a pane is preferred.

An optional equilibration port 34 is formed in the wall of one of the half-pipes so as to have openings to the spaces 36 and 38 between the panes. This equilibration port mates with an equilibration port 34' which is formed in the wall of the vacuum chamber so as to open into the vacuum chamber. This equilibration port equalizes the pressure in spaces 18, 36 and 38 so that there are no atmospheric pressure forces acting on the inner panes 14 and 16 tending to push them toward the vacuum chamber 18. The existence of the ports 34' and 34 essentially evacuates the chambers 36 and 38 between the panes 16 and 14 and between panes 14 and 12. This is preferred because it reduces the atmospheric pressure acting on panes 14 and 16 and because it eliminates a rush of gas from chambers 36 and 38 into the vacuum chamber in case of a failure of panes 16, 14 or both. A sudden rush of gas into the vacuum could ruin the turbo pumps in the vacuum system by bending the stator blades toward the spinning rotor blades of the pump which would damage the rotor blades if contact was made. This usually results in a near total destruction of the pump. In addition, flying shrapnel could injure or kill a bystander. If one pane fails, as long as at least one of the other panes is still intact, a sudden inrush of gas into the vacuum system chamber is avoided.

The equilibration path 34' and 34 should have a restriction mechanism in it to prevent completely unrestricted flow of gas into the vacuum chamber during pump down. A completely unrestricted path 34 will be risky if the valve is open, and may not work at all since damage to the turbo pump may occur. The path 34 in the embodiments shown in FIG. 1 is restricted by valve 35 such that the path between the chambers 36 and 38 and the vacuum chamber 18 can be shut off or opened. In using this type embodiment, the valve 35 is opened at various intermediate stages during the pump down of vacuum chamber 18 to evacuate the gas in spaces 36 and 38. Preferably the intervals between valve openings are spaced out so as to avoid a large amount of gas entering the vacuum chamber suddenly. The preferred embodiment for the equilibration path is a "seeping" path which can be either: 1) a path like that shown in FIG. 1 without the valve but filled with sintered metal to impede flow of gas through the path so as to let spaces 36 and 38 equilibrate slowly with the pressure in the vacuum chamber 18; or 2) a pinhole path with a tiny diameter which allows equilibration over time but does not allow gas to flow rapidly between spaces 36 and 38 and the vacuum chamber 18, or any other type of flow restrictor.

Because of the reduced atmospheric pressure forces acting on panes 16 and 14, these panes can have less thickness or less strength or both than outer pane 12 which must have sufficient strength to withstand the whole brunt of atmospheric pressure acting to push pane 12 toward the vacuum chamber inner spaces. Preferably, all panes will have sufficient strength to withstand atmospheric pressure so that a chain reaction failure does not occur if the outer pane 12 fails thereby exposing pane 14 to atmospheric pressure.

Typical thicknesses for single panes of prior art vacuum system viewing ports are from 1 millimeter to 6.5 mm. A 10" diameter viewing port has a pane thickness of 10 mm in one prior art application. These thicknesses plus some safety margin will be adequate for the outer pane 12.

The preferred embodiment is for the outer pane 12 to be single-crystal, high-quality, flawless, super-polished sapphire. The middle and inner panes 14 and 16 can also be be single-crystal, high-quality, flawless, super-polished sapphire, or they can be any combination of glass and quartz. Any surface cracks or scratches can lead to failure of the pane because cracks or scratches may act as the start of a crack under stress thereby possibly exceeding the strength of the material and leading to bulk fracture or catastrophic failure of the pane. Special polishing eliminates surface scratches thereby removing the possibility of localized points of concentrated stress on the material of the pane. Localized stress concentration can also be caused by differential thermal expansion rates caused by the rapid or non-uniform or localized (or any combination thereof) heating of a pane at the point where the laser beam 41 passes through it. This heating can be to the vicinity of 400 to 500 degrees Centigrade, especially if there is skin oil, dust, other contaminants or dirt on the pane. Localized patches of skin oil, dirt or other contaminants can cause one area of the pane through which a high energy laser beam is passing to heat up more than the surrounding areas. This causes the heated area to thermally expand (often rapidly) more than the surrounding glass which causes differential thermal expansion in the hot and colder areas thereby leading to internal stress in the pane. The preferred embodiment uses three panes all of which are single-crystal, high-quality, flawless, super-polished sapphire. However, in other embodiments, different materials other than sapphire can be used for the one or more of the three layers, but it is still preferred for all three panes to be super-polished regardless of what type material they are.

In the preferred embodiment, the space between the panes 12, 14 and 16 is sufficient in size to avoid or minimize "shrapnel" damage to other layers when a layer fails. "Shrapnel damage" refers to scratches or nicks in the surface of another layer caused by flying chips of glass, sapphire or quartz when a pane bursts in a catastrophic failure. When one pane fails such as the outer pane, if shrapnel damage occurs to the next pane in toward the vacuum chamber, that damage can cause localized stress and, because the atmospheric pressure is now affecting the next pane in, that pane can fail at the localized stress points caused by the shrapnel damage. Typical spacing to avoid this type of damages is 1 to 2 inches apart. Larger spacing is used for larger diameter panes. Though, in some cases, short spacing can be advantageous, because there is less volume for the inrushing air.

Figure 2:
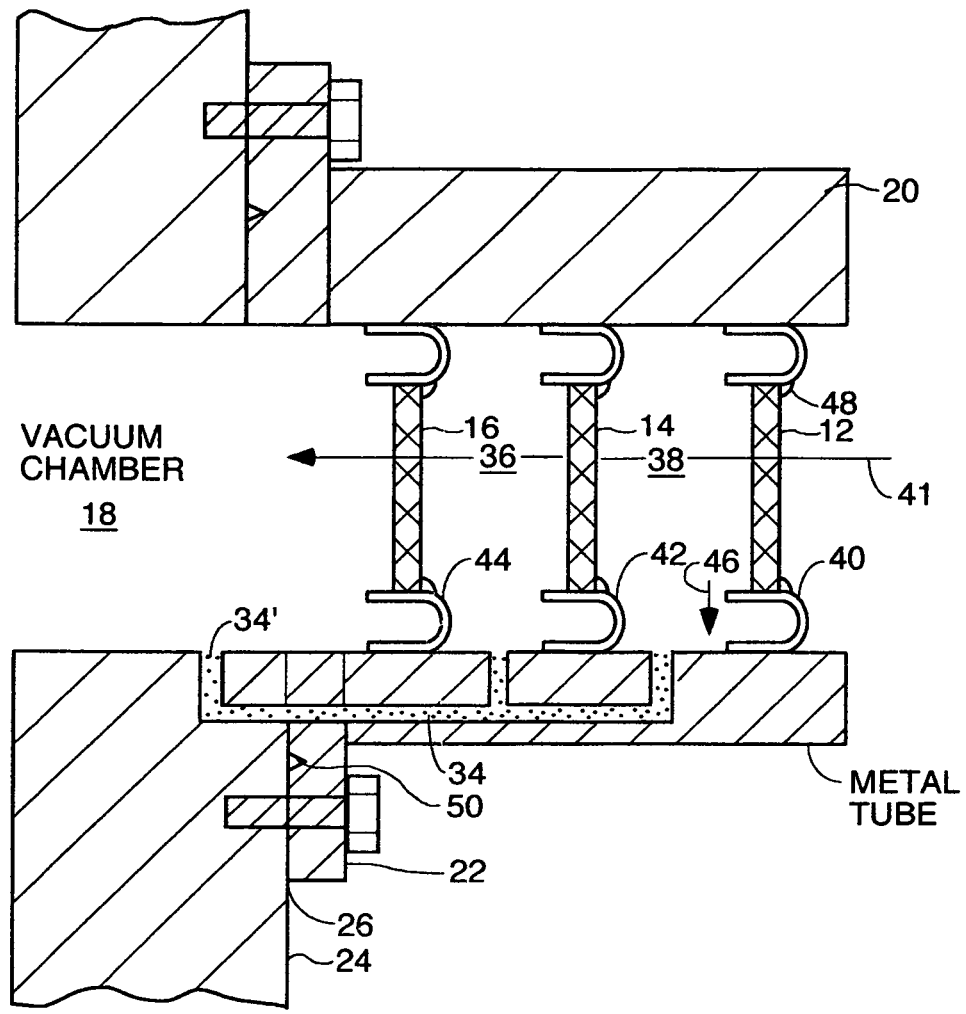
FIG. 2 is a cross-sectional view of one embodiment of a three pane fracture-safe vacuum port using a flexible donut ring mounting for each pane to relieve stress.

Referring to FIG. 2, there is shown a preferred embodiment. FIG. 2 is a cross-section drawing of an embodiment of the fracture-safe vacuum system viewing port using three panes of different types of transparent material, a flexible, metal, U-shaped or half-donut shaped stress relief mounting mechanism and an equilibration port filled with sintered metal. The viewing port is made of a metal tube 20 in which the three panes 12, 14 and 16 are mounted internally inside metal, flexible, hollow, half-donut or U-shaped mounts 40, 42 and 44 (hereafter sometimes referred to as U-shaped mounts or half-donuts). In the claims these U-shaped mounts and any other mounting mechanisms to mount the panes to the support structure (typically a stainless steel tube) are referred to as strain relief mounting structures. The metal tube 20 is made of stainless steel or other metal, and the flexible donuts are made of Invar or Kovar or some material which has a coefficient of thermal expansion which matches or substantially matches the coefficient of thermal expansion of the material of the panes. When the panes are of different materials, as is the case in the embodiment of FIG. 1 (as indicated by the three different cross hatching patterns), a match of thermal expansion coefficient for all three panes may not be possible. Even if there is a mismatch of the coefficients of thermal expansion for one or more panes however, the physical configuration of the half-donut shaped stress relief mechanisms still acts to relieve stress by relieving strain differences caused by different rates of thermal expansion between the pane and the metal donut. This is done by taking up the expansion of the pane with heating by collapsing of the donut inner wall toward the outer wall in the direction shown by arrow 46. The flexible U-shaped mounts are more in the shape of a hollow donut which has been sliced down the middle with a plane that passes through the largest diameter circle in the circumference or perimeter of the donut—it is a half of a hollow metal donut which has been sliced through the middle in the same way a bagel is normally sliced to form a half-donut. The hollow nature of the half-donut allows the walls to which the panes 12, 14 and 16 are attached to flex toward the inner walls which are attached to the inner wall of the tube 20.

Figure 12:
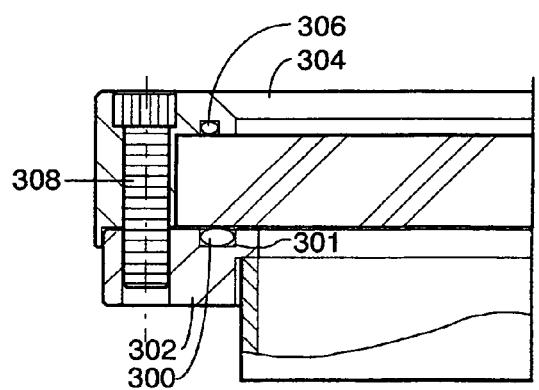
FIG. 12 is a cross-sectional view of an O-ring, clamp based mounting mechanism to mount a pane to the metal tube of the safe view port.

The half-donut strain relief mounting structures like 40 are most useful in ultra-high vacuum systems with or without temperature cycling. In other systems, the flexible half donut mounting mechanisms can be eliminated and an O-ring based clamping mechanism may be substituted as shown in FIG. 12. In this mount, the pane is squeezed onto an O-ring 300 resting in a groove 301 on a flange 302 (a flat flange surface may also be used). The pane is squeezed onto the O-ring by a metal ring 304 which, optionally, has another O-ring 306 and another groove in which the O-ring rests. The metal 304 is pushed down on the pane by a clamping mechanism which, in the prior art embodiment shown, is a bolt 308 threaded into flange 302. This mechanism can be used to mount all or some of the panes in systems suitable for this type of mounting mechanism. There is strain relief in two dimensions in this type mounting. Strain relief in the axial dimension is provided by compressing the O-ring. Strain relief in the radial direction is provided by making the diameter of the pane less than the diameter of the mounting mechanism.

To construct the structure shown in FIG. 2, a number of flexible half-donuts having an outside diameter which matches the inside diameter of the tube 20 are inserted at intervals along the length of the tube 20. Each flexible half-donut is brazed to the wall of the tube or attached by some means which has sufficient strength to withstand the atmospheric pressure and which forms a hermetic seal. Each of panes 12, 14 and 16 is then attached to the inner wall of the flexible half-donut by slipping a pane having the required material and a diameter equal to the inside diameter of the flexible half-donut into the ring and placing a bead 48 of low temperature solder around the perimeter of each of the panes. The structure is then heated to melt the solder to form a mechanical bond and hermetic seal.

The tube 20 has an equilibration passageway 34 formed in the wall thereof which has openings into the spaces 36 and 38 between the panes 12, 14 and 16. The equilibration passageway passes through flange 22 and mates to a passageway 34' formed in the wall of the vacuum chamber so as to open into the vacuum chamber 18. The equilibration passageway has a flow restriction in it to prevent rapid flow of gas from chambers 36 and 38 into the vacuum chamber 18. The flow restriction device shown in FIG. 2 is sintered metal, but a pinhole restriction can also be used or a valve can be inserted so as to selectively block the passageway as was the case for the embodiment of FIG. 1.

As was the case for the embodiment of FIG. 1, the flange 22 is bolted to the wall 24 of the vacuum chamber and a hermetic seal at 26 is formed. The hermetic seal can be formed by a knife edge 50 (a small sharp protrusion of metal which juts above the flat surface of the vacuum chamber wall) which is formed on the wall of the vacuum chamber which sticks into a flexible o-ring seal between the flange 22 and the wall 24.

Figure 3:
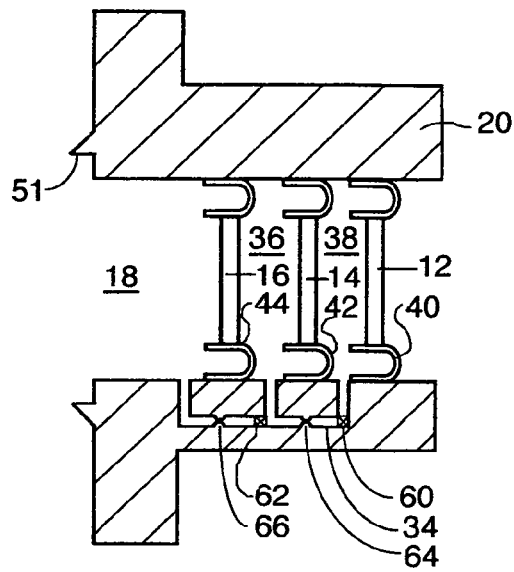
FIG. 3 is a cross-sectional view of another embodiment having flexible donut ring stress relief structures and an equilibration path which has two valves and one or two flow restriction orifices (two are shown).

FIG. 3 is a cross-sectional view of another embodiment like that of FIG. 2 having flexible half-donut ring stress relief structures to mount the transparent panes, but this embodiment has an equilibration path which has two valves and a flow restriction orifice. The three panes can be all the same material or some combination of materials as in the other embodiments, and the flexible, hollow half-donuts 40, 42 and 44 all have the same structure and function as in the embodiment of FIG. 2. The equilibration path 34 has two valves 60 and 62 in it which can be shut off to close off the path. These valves can be used to isolate each of the chambers 36 and 38 from the vacuum chamber 18 and opened at various intervals during the pump down. Two flow restricting orifices 64 and 66 prevent a sudden inrush of gas into vacuum chamber 18 when valves 60 or 62 are opened. By isolating chambers 36 and 38 individually, chamber 36 can be pumped down in steps without the gas from chamber 38 being involved, and then chamber 38 can be pumped down after chamber 36 is pumped down with the two flow restriction orifices 64 and 66 preventing a sudden inrush of gas when valve 60 is opened with valve 62 open after chambers 18 and 36 have been pumped down.

Figure 4:
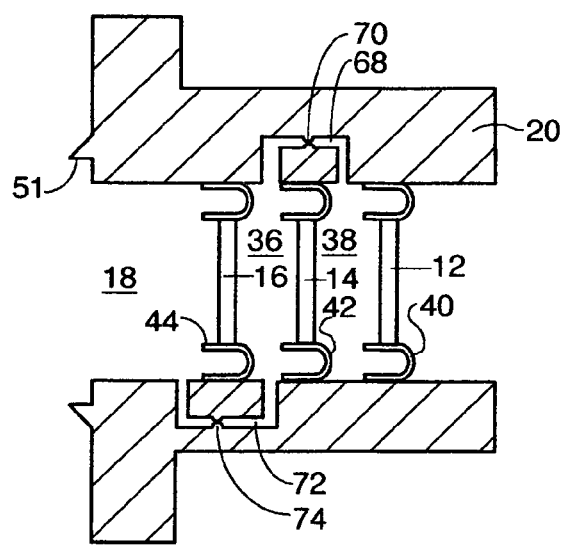
FIG. 4 is a cross-sectional view of another embodiment like that of FIG. 2 having flexible donut ring stress relief structures to mount the transparent panes, but this embodiment has two separate equilibration paths, each of which has a flow restriction orifice.

FIG. 4 is a cross-sectional view of another embodiment like that of FIG. 2 having flexible half-donut ring stress relief structures to mount the transparent panes, but this embodiment has two separate equilibration paths, each of which has a flow restriction orifice. The three panes can be all the same material or some combination of materials as in the other embodiments, and the flexible, hollow half-donuts 40, 42 and 44 all have the same structure and function as in the embodiment of FIG. 2. A first equilibration path 68 with flow restriction orifice 70 couples chambers 36 and 38, but in an alternative embodiment, path 68 could go all the way to the vacuum chamber. A second equilibration path 72 with a flow restriction orifice 74 couples chamber 36 with vacuum chamber 18.

Figure 5:
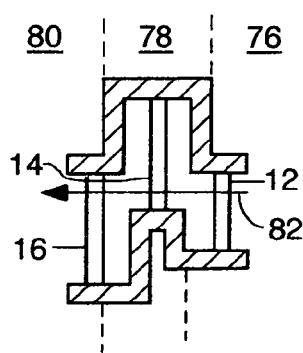
FIG. 5 is a cross-sectional view of another embodiment which uses offset panes such that the laser beam does not pass through the center of each pane.

FIG. 5 is a cross-sectional view of another embodiment which uses offset panes for a fracture-safe embodiment. Fracture safe viewport embodiments are embodiments where a mechanical blow to a pane or fracture of a pane caused by unequal localized heating caused by passing a laser beam through the pane can causes a fracture and where backup panes prevent a sudden inrush of gas into the vacuum chamber. The offset pane structure of FIG. 5 causes the laser beam to not pass through the center of each pane when directed through the viewport. The reason that this is done is because the center of the panes are where the stress is most concentrated. Therefore, passing a laser beam through the center of the pane or a mechanical blow to the center of the pane is more likely to cause a catastrophic fracture of the entire pane because of the concentration of stress. If a mechanical blow or uneven heating caused by a laser beam starts a microfracture, the concentrated stress in the vicinity of the center is more likely to cause the microfracture to grow to a full fracture and cause the pane to fail. If the laser beam is not passed through the center or a mechanical blow occurs out near the edge of a pane, this catastrophic failure is less likely to occur.

In this embodiment, the tube 20 in which the transparent panes are mounted has three sections indicated by reference numbers 76, 78 and 80. Each of these sections have their centerlines offset from each other and is attached to the neighboring section by any means such as flanges and bolts with a circular knife edge around the circumference of one of the flanges which bites into a sealing ring or gasket placed between the mating flanges. An example of such a sealing arrangement is symbolized by knife edge 50 in FIG. 2 and knife edge 51 in the embodiments of FIGS. 3 and 4. Each section mounts one of panes 12, 14 and 16. The mounting of the panes to the inner walls of the section of the tube can be by the use of the same type of flexible, hollow half-donut mounting rings (not shown) as were used in the embodiments of FIGS. 2 through 4. Any other form of mounting the panes which can alleviate stress caused by different rates of thermal expansion as between the material of the pane and the material of the metal tube may also be used. For example, and this is true of all embodiments disclosed herein, a glass pane may be slipped inside a tubular ring so as to rest on a circular bead of glass having an outside diameter which matches the inside diameter of the metal tube. Any other material which has a coefficient of thermal expansion which is approximately the same as the material of the pane can be substituted for the glass ring bead. The structure is then heated until the glass of the ring bead fuses with the glass of the pane.

Figure 6:
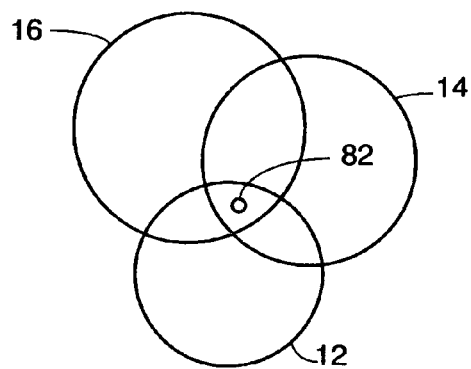
FIG. 6 is a Venn diagram type view showing the axial view looking down the axis that the laser beam travels showing how the three panes overlap and the laser beam passes through a section where all three panes overlap.

Each section typically has the same inside diameter, but this is not necessary and each section diameter may be different in diameter so long as a laser beam represented by arrow 82 can pass through some portion of each of the three panes, as symbolized by the Venn diagram of FIG. 6. FIG. 6 is a diagram showing one possibility for the overlapping circumferences of panes 12, 14 and 16 with the laser beam represented by small circle 82 passing through the overlapping portion of the three circumferences.

Figure 7:
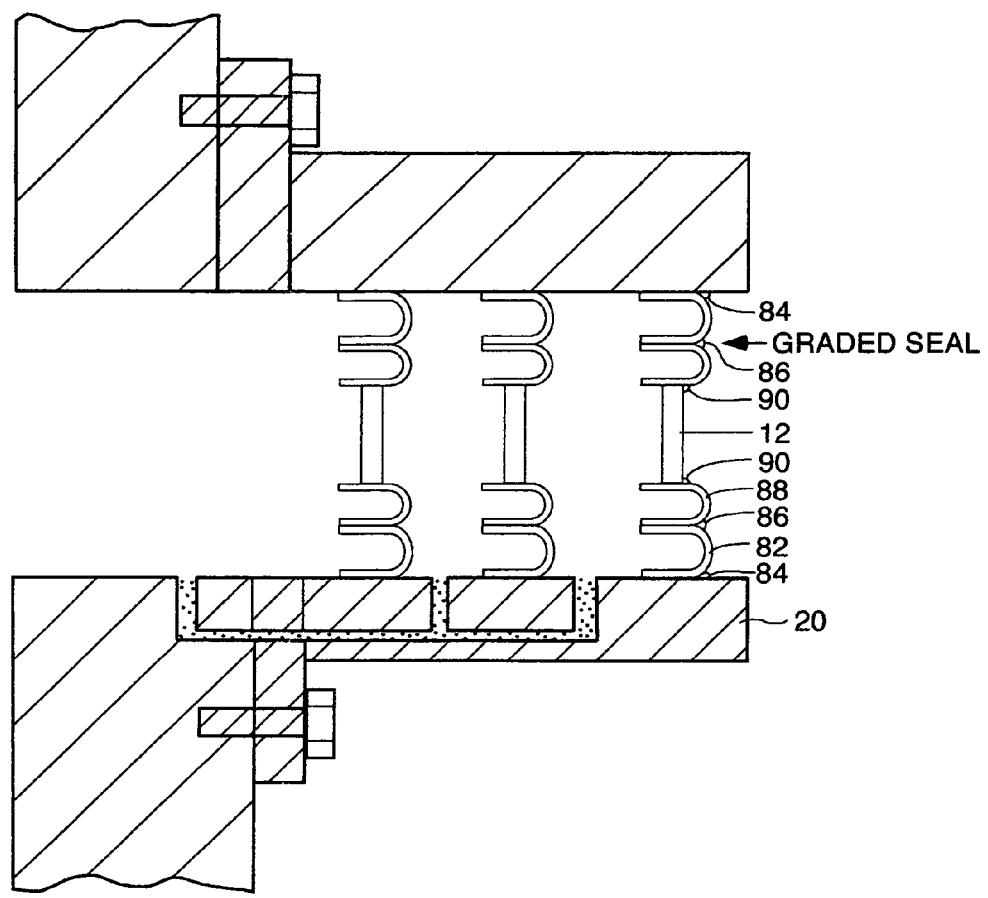
FIG. 7 is a cross-sectional view of an embodiment which uses a graded seal having two flexible donut seals for each pane, each having a different coefficient of thermal expansion.

FIG. 7 is a cross-sectional view of an embodiment which uses a graded seal having two flexible half-donut seals for each pane, each having a different coefficient of thermal expansion. The first flexible half-donut sealing ring 82 is the same as the half-donut mount rings 40, 42 and 44 in FIG. 3 but made of a material which closely matches the coefficient of thermal expansion of the tube 20 which may be Invar or Kovar or stainless steel. The half-donut is sealed to the tube 20 by a bead of solder 84 which is melted later when the structure is heated to seal the panes to the mounting rings, the mounting rings to each other and the outer mounting ring to the tube 20. The outer mounting ring 82 is sealed by a bead of solder 86 to an inner mounting ring 88 which is sealed to the pane 12 by a bead of solder 90. The inner mounting ring 88 is flexible, hollow, half-donut like those shown at 40, 42 and 44 in FIG. 3, and is made of a material which is closer in coefficient of thermal expansion to the coefficient of thermal expansion of pane 12 than is the material of mounting ring 82.

Figure 8:
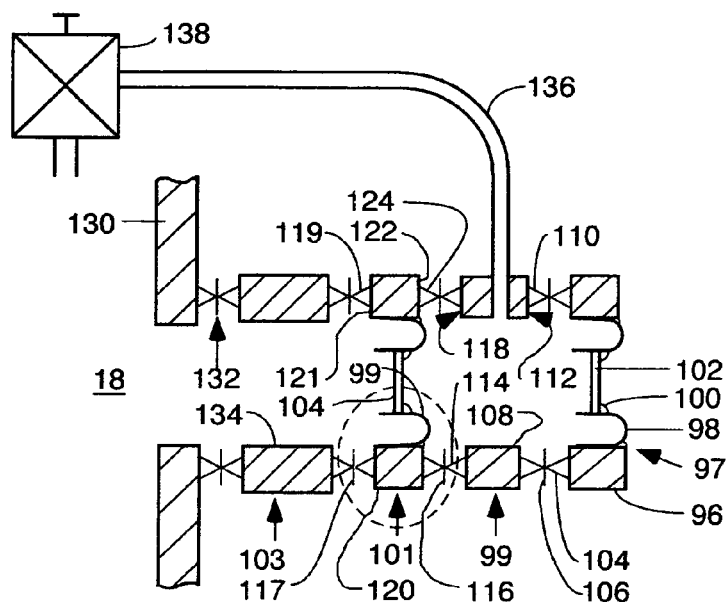
FIG. 8 is a cross-sectional view of a two-pane, fracture-safe vacuum system viewport built in three separate sections and using flexible, hollow half donuts or U-shaped pane mounts for strain relief.

FIG. 8 is a cross-sectional view of a two-pane, fracture-safe vacuum system viewport built in four separate sections and using flexible, hollow half-donuts or U-shaped pane mounts for strain relief. A first section 97 is comprised of a metal tube section 96 having attached thereto by a braze or solder bead 100 a flexible, hollow, half-donut shaped strain relief mount 98 for a transparent pane 102. Mount 98 is made of a metal which has a coefficient of thermal expansion which is approximately the same that of the pane 102. This assembly is sealed to an adjacent section by a knife edge protrusion 104 which bites into a copper O-ring 106 between 97 and its neighboring section 99 around the entire perimeter of section 97 so as to form a hermetic seal. Although copper O-rings are used in many embodiments, the O-rings can be Indium or any other soft material such as rubber or pretty much any elastomeric substance which can form a hermetic seal when a knife edge digs into it.

The second section 99 does not contain a transparent pane, but functions to provide spacing between the first transparent pane 102 and the second transparent pane 104 in the third section 101. The second section is comprised of a metal tubular section 108 that has a knife edge 110 extending from one flat surface 112 serving as a flange and which serves as the joint surface that joins sections 97 and 99. The knife edge 110 bites into the copper O-ring 106 around the entire perimeter of section 99 to form a hermetic seal when sections 97 and 99 are bolted or clamped together (bolts and flanges not shown). Section 97 also includes a knife edge 114 that extends around the entire perimeter of a flat joint surface 118 and bites into a copper O-ring 116 to form a hermetic seal between section 99 and neighboring section 101 which mounts transparent pane 104.

A third section 101 mounts said pane 104 and is comprised of a metal tube 120 which has a flat surface 122 from which extends knife edge 124 around the entire perimeter of flat surface 122. The knife edge 124 bites into copper O-ring 116 to form a hermetic seal between sections 99 and 101 when these two sections are bolted or clamped together. A knife edge 119 bites into a copper O-ring 117 on the opposite flat surface 121 of the tube section 120 to form a hermetic seal to the neighboring section 103. Fastening mechanisms to fasten the two sections to each other are not shown.

Figure 10:
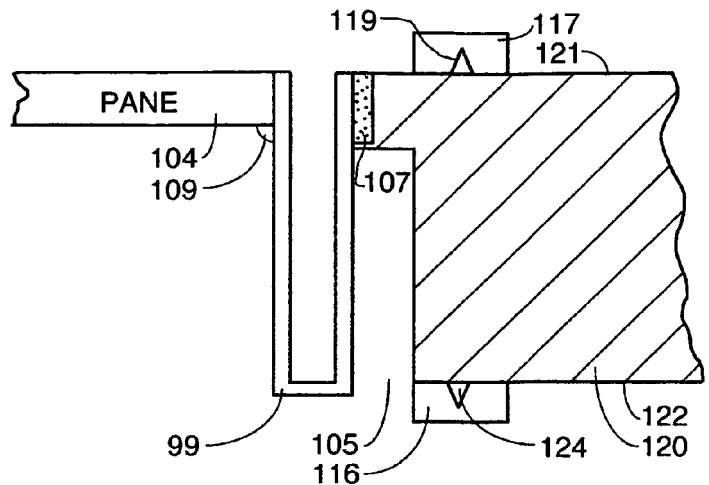
FIG. 10 provides more detail of the mounting of the pane to the half donut and of the mounting of the half donut to the tube wall.

Transparent pane 104 is preferably ultra-pure, ultra-polished, single-crystal, defect-free sapphire, and is mounted to the internal wall of tube 120 using a flexible, hollow, half-donut mounting structure for strain relief caused by different rates of thermal expansion as between the panes and the metal of the tube in which the panes are mounted as the structure is heated. More detail of the mounting of the pane to the half donut and of the mounting of the half donut to the tube wall is shown in FIG. 10. Half donut mounts 98 and 99 for panes 102 and 104 are each made of a metal, typically Kovar, or other material which is flexible and which has a coefficient of thermal expansion which is matched or close enough to the coefficient of thermal expansion of the transparent pane mounted to the half-donut to provide strain relief between different physical expansions or contractions of panes 102 and 104 versus the metal of tubes 96 and 120 as the structure is heated or cooled.

The fourth section 103 provides space between the pane 104 and the vacuum chamber 18 having wall section 130 in which an opening is formed around which the viewing port structure of FIG. 8 is attached. A knife edge, O-ring sealing mechanism is shown at 132 between the metal tube 134 of section 103 and the wall 130 of the vacuum chamber. The space between transparent panes 104 and 102 is equilibrated to the level of vacuum in the chamber 18 by an equilibration path 136 which is vented to the vacuum chamber 18 through a valve 138 which can be opened from time to time (or just left open) during the pump down to pump out the chamber between panes 102 and 104.

Figure 9:
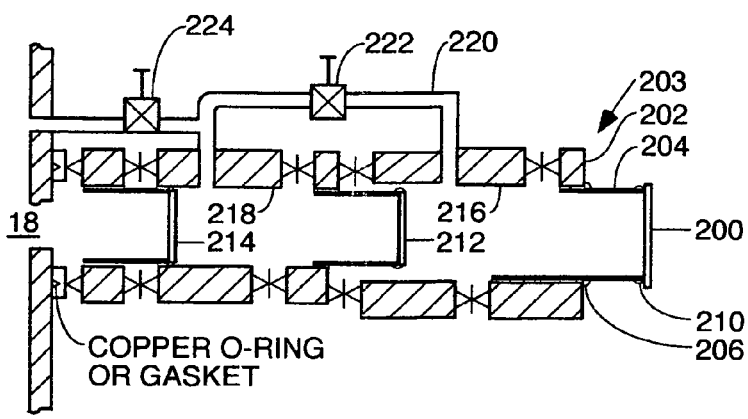
FIG. 9 is a cross-sectional view of a three-pane, fracture-safe vacuum system viewport built in five separate sections and using flexible chimney type strain relief sections to fasten each pane to its section.

FIG. 9 is a cross-sectional view of a three-pane, fracture-safe vacuum system viewport built in five separate sections and using flexible chimney type strain relief sections to fasten each pane to its section. A first transparent pane is mounted to first section 203 by a round chimney-shaped mounting tube 204. The chimney mount 204 is made of a flexible metal or other material which can flex as the inside diameter of the metal tube 202 of section 203 changes its inside diameter with temperature changes. The bottom section of the chimney 204 is soldered or brazed at 206 to the metal tube 202. The chimney mount has a center axis which extends to the right in FIG. 1 where pane 200 is mounted to the top end of the mount. Mounting of pane 200 to the top of the chimney mount can be by any suitable mechanism that forms a hermetic seal. For example, a circular glass bead 210 may be attached to the outer diameter of the chimney mount at the top and the transparent pane may be set on the glass bead. The structure is then heated to fuze the glass bead with the material of the pane to form the mount and seal. The glass bead could also be placed inside the chimney mount to ring the inside perimeter just below the top of the mount to form a lip around the inside edge of the top of the mount with just enough spacing down from the top to allow a transparent pane to be slipped inside the chimney mount so as to rest on the bead. A transparent pane having an outside diameter that matches the inside diameter of the mount is then inserted into the top of the chimney mount, and the structure is heated to fuse the glass bead with the material of the pane 200 to form the mount and seal.

Strain caused by different rates of thermal expansion between the metal of tube 202 and the material of pane 200 is absorbed by the flexibility of the walls of chimney mount 204 so as to not cause stress on pane 200. Each of the other two panes 212 and 214 are also attached to their respective sections of the structure by a chimney mount for strain relief. Each of the sections is joined to its neighboring section by a knife edge which rings the circumference of the section and digs into a copper O-ring in the same manner as described for the embodiment of FIG. 8.

The sections formed by tubular metal walls 216 and 218 are present to provide additional spacing between panes 200, 212 and 214 to prevent damage from flying fragments in case one of the panes fails. The sections formed by tube sections 218 and 216 are equilibrated to the vacuum system pressure by an equilibration path 220 between the vacuum chamber 18 and two spaces formed by sections 218 and 216. The equilibration path is gated by valves 222 and 224 so that the spaces between panes can be gradually evacuated by periodic opening of the valves at different stages of the pump down (or just left open during the pump down) to avoid a sudden inrush of a large amount of gas into the vacuum chamber 18 and possible damage to the turbo pump.

Typically, in all the embodiments shown in the figures, the metal of the tube walls of the various sections of the viewport is stainless steel, and the metal of the flexible U-shaped or half-donut strain relief mounts or chimney-shaped strain relief mounts for the transparent panes is Kovar or Invar, or alloys thereof. But any materials that can perform the strain relief and other functions recited will suffice. The bonds between the flexible half-donuts or chimney mounts and the transparent panes and between the flexible half-donuts or chimney mounts and the walls of the tube sections can be a braze, a bead of solder or glass fusing the two parts being bonded (depending upon the materials) or any suitable adhesives.

The stacked structure of FIG. 9 can be repeated as many times as necessary to add more panes and spaces between panes with an equilibration path between each space between panes, and an equilibration path between the final space and the vacuum system.

FIG. 10 is a blown up cross-sectional view of the tube section and bonds for the portion of the structure shown in FIG. 8 enclosed in a dashed circle. This drawing shows an optional recess 105 formed in the wall of the tube 120 facing the half-donut mount 99. The purpose of this recess is to provide expansion room into which the metal of the half-donut mounting ring can expand if necessary for strain relief. A braze or ceramic adhesive bond 107 is used to mount the half-donut mount to the tube 120. A glass bead or bead of ceramic adhesive 109 can be used to attach the pane 104 to its half-donut mount.

Figure 11:
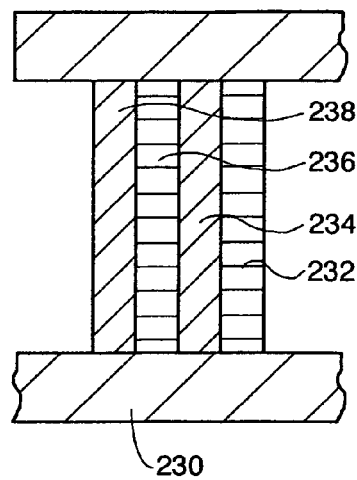
FIG. 11 is a cross-sectional view of another embodiment of a multipane, fracture-safe viewport. The viewport of this embodiment is comprised of a tube 230 of stainless steel with four transparent panes 232, 234, 236 and 238 mounted therein. The panes can be mounted with slight spaces therebetween or mounted as a sandwich with no space between each pane.

FIG. 11 is a cross-sectional view of another embodiment of a multi-pane, fracture-safe viewport. The viewport of this embodiment is comprised of a tube 230 of stainless steel with four transparent panes 232, 234, 236 and 238 mounted therein. The panes can be mounted with slight spaces therebetween or mounted as a sandwich with no space between each pane. All four panes can be mounted on one flexible half-donut shaped mount by the same means as previously described if there is space between them or with single beads of glass or adhesive sealing the outer panes 232 and 238 to the half-donut mount (not shown). The half-donut mount may also be mounted to the inner walls of the tube 230 by brazing or adhesive in the manner previously described. The tube is mounted by a hermetic seal to the walls of the vacuum chamber by a flange, and a knife edge that extends around the perimeter of the flange and which digs into a copper O-ring between the flange and the wall of the vacuum chamber. All four panes may be the same material or any combination of materials can be used. Preferably alternating layers of glass and sapphire are used with the sapphire being ultra pure, defect-free, ultra-polished, single-crystal sapphire.

Figure 13:
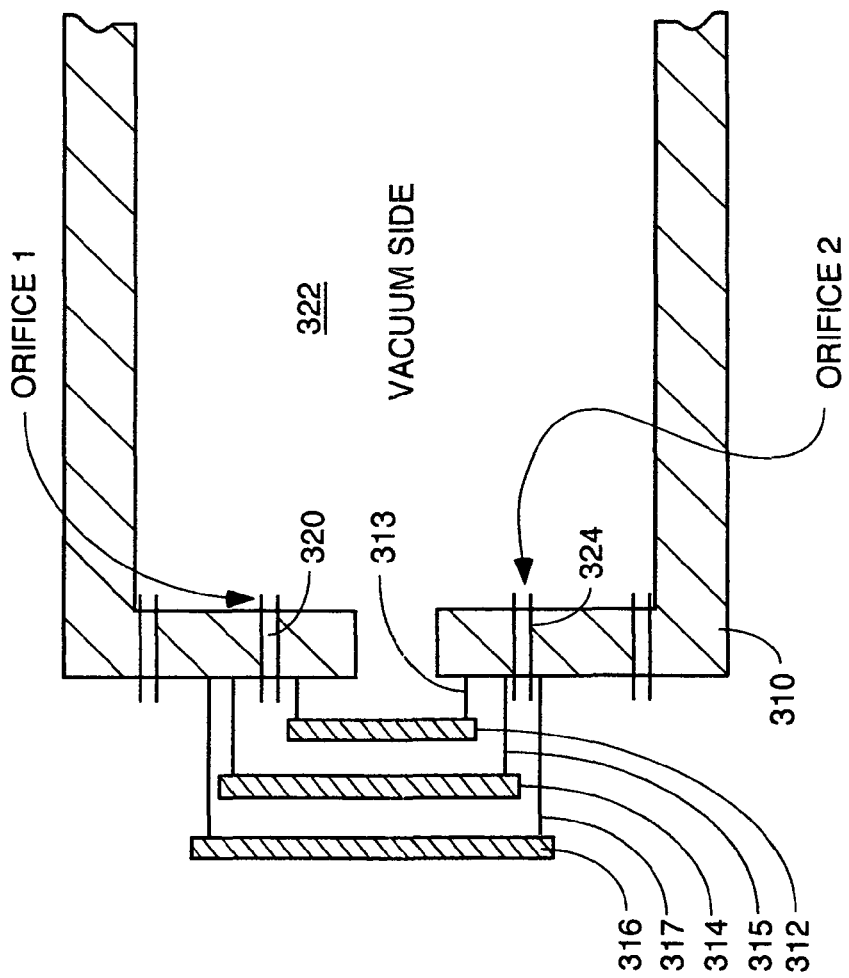
FIG. 13 is a cross-sectional view of another embodiment of a safe viewport with nesting panes of different diameters.

FIG. 13 is a cross-sectional view of another embodiment of a fracture-safe viewport with nesting panes of different diameters. In this embodiment, a metal tube 310 serves as the support structure for the panes. This metal tube 310 has a mounting flange and hermetic sealing mechanism (not shown) which is like the flange and knife edge mounting/sealing mechanisms shown in the other embodiments such as the embodiment of FIG. 2. To this supporting structure, there is mounted a first pane 312 which is mounted on a first strain-relieving mount 313 which has a first diameter. The strain-relieving mount 313 can have the same structure as any of the other strain-relieving mounts previously described. A second pane 314 having a larger diameter than the first pane 312 is mounted to the support structure on a second strain-relief mount 315 which is larger in diameter than mount 313 and longer so as to space pane 314 away from pane 312. A third pane 316 having a larger diameter than the second pane 314 is mounted on a third mount 317 which is larger in diameter than mount 315 and longer so as to space pane 316 away from pane 314. The space between pane 312 and 314 is equilibrated by a flow restricted path 320 to the vacuum chamber 322. Flow restriction can be by a valve, sintered metal and/or a pinhole orifice. The space between pane 314 and 316 is equilibrated by a flow restricted path 324 to the vacuum chamber 322. Flow restriction can be by a valve, sintered metal and/or a pinhole orifice. The advantage of this embodiment is that all the equilibration paths are in one flange and the structure will be more compact because of the nesting nature of the panes and their mounts. The panes can be mounted to their mounts by fusing the material of the pane to the tops of their respective mounting tubes.

Although the invention has been disclosed in terms of the preferred and alternative embodiments disclosed herein, those skilled in the art will appreciate that modifications and improvements may be made without departing from the scope of the invention. All such modifications are intended to be included within the scope of the claims appended hereto.

What is claimed is:

1. A fracture-safe viewport, comprising:
a support structure having as part thereof means for attaching the support structure around a port in a vacuum, gas or liquid chamber wall and forming a hermetic seal therewith, said chamber for holding a vacuum or gas or liquid under pressure;
two or more panes in proximity to each other and all on the same side as said port, the said two or more panes forming one viewport capable of passing a laser beam or other electromagnetic energy therethrough, said two or more panes being mounted to said support structure and hermetically sealed to said support structure either with or without a strain relief mounting structures and forming one or more spaces, each space being between an adjacent pair said panes; and
an equilibration path for allowing transfer of gas or liquid between said chamber and said one or more spaces between adjacent ones of said two or more panes.

2. The viewport of claim 1 wherein said panes are selected from the group comprising sapphire, quartz, glass, silicon, gallium arsenide, indium phosphide, polycarbonate, magnesium fluoride, calcium fluoride, zinc selenide, zinc sulfide, silicon carbide, gallium nitride, yittrium iron garnet, yittrium aluminum garnet, lithium niobate, lithium tantalate or any material which is transparent to electromagnetic radiation.

3. The viewport of claim 1 wherein three transparent panes are used.

4. The viewport of claim 1 wherein at least one of said panes is ultra-pure, defect-free, ultra-polished, single-crystal silicon.

5. The viewport of claim 1 wherein at least one of said panes is ultra-pure, defect-free, ultra-polished, single-crystal sapphire.

6. A fracture-safe viewport for mounting with a hermetic seal to the pressure chamber of a system which pumps said pressure chamber to a pressure above or below atmospheric pressure, comprising:
a tubular metal support structure having a flange and sealing mechanism to form a hermetic seal around an opening in a wall of a pressure chamber of a system which pumps said pressure chamber to a pressure either above or below atmospheric pressure;
a first pane capable of passing a laser beam or other electromagnetic energy, and having a first diameter mounted to said support structure either with or without a strain relief mechanism and mounted so as to form a hermetic seal to said support structure;
a second pane capable of passing a laser beam or other electromagnetic energy, and having a second diameter which is larger than said first diameter and mounted to said support structure either with or without a strain relief mechanism and mounted so as to form a hermetic seal to said support structure and to encompass said first pane and its mounting structure;
a third pane capable of passing a laser beam or other electromagnetic energy, and having a third diameter which is larger than said second diameter and mounted to said support structure either with or without a strain relief mechanism and mounted so as to form a hermetic seal to said support structure and to encompass said first and second panes and their mounting structures; and
a first equilibration path to allow transfer of gas or liquid between said pressure chamber and the spaces between said first and second pane so that the space between said panes and said chamber is equilibrated to the same or approximately the same pressure; and
a second equilibration path to allow transfer of gas or liquid between said pressure chamber and said second and third pane so that the space between said panes and said chamber is equilibrated to the same or approximately the same pressure.

7. The fracture-safe viewport of claim 6 wherein each of said first, second and third panes are selected from the group comprising sapphire, quartz and glass, silicon, gallium arsenide, indium phosphide, polycarbonate, magnesium fluoride, calcium fluoride, zinc selenide, zinc sulfide, silicon carbide, gallium nitride, yittrium iron garnet, yittrium aluminum garnet, lithium niobate, lithium tantalate, ZnSe, polymers or plastics, silicon, $MgF_2$ or any material which is transparent to electromagnetic radiation.

8. A fracture-safe viewport, comprising:
a support structure divided into multiple spaced segments, each segment hermetically sealed to its neighboring segments, at least one section of which has as part thereof means for attaching and hermetically sealing said support structure around a port in a pressure chamber wall of a system capable of pumping said pressure chamber to a pressure above or below atmospheric pressure, and wherein some of said sections of said support structure are spacer sections, and some of said sections are for mounting panes therein;
a plurality of spaced apart panes, each mounted in one of said sections of said support structure which are for mounting of panes therein, all panes being on the same side of said port, and each pane capable of passing a laser beam or other electromagnetic energy, and wherein each said pane is mounted to its section of said support structure either with or without strain relief mounting structures and each pane mounted in such a way as to form a hermetic seal with its section; and
an equilibration path which is always open while there is vacuum in said chamber or qas or liquid under pressure in said chamber, said equilibration path for allowing transfer of gas or liquid between said chamber and spaces between said panes so that all said spaces between panes and said pressure chamber are equilibrated to the same or approximately the same pressure as found in said chamber.

9. The viewport of claim 8 wherein each said pane is mounted to its section of said mounting structure using a U-shaped or half-donut shaped, hollow, metal strain relief mounting structure.

10. The viewport of claim 8 wherein each said pane is mounted to its section of said mounting structure using a chimney-shaped mounting structure.

11. The viewport of claim 8 wherein each pane is selected from the group comprising sapphire, quartz and glass, silicon, gallium arsenide, indium phosphide, polycarbonate, magnesium fluoride, calcium fluoride, zinc selenide, zinc sulfide, silicon carbide, gallium nitride, yttrium iron garnet, yttrium aluminum garnet, lithium niobate, lithium tantalate, ZnSe, polymers or plastics, silicon, $MgF_2$ or any material which is transparent to electromagnetic radiation.

12. The viewport of claim 9 wherein at least one pane is ultra-pure, defect-free, ultra-polished, single-crystal sapphire.

\* \* \* \* \*